United States Patent [19]
Okazawa et al.

[11] Patent Number: 5,523,976
[45] Date of Patent: Jun. 4, 1996

[54] NON-VOLATILE SEMICONDUCTOR MEMORY DEVICE HAVING A MEMORY CELL GROUP OPERATIVE AS A REDUNDANT MEMORY CELL GROUP FOR REPLACEMENT OF ANOTHER GROUP

[75] Inventors: Takeshi Okazawa; Kenji Saitoh, both of Tokyo, Japan

[73] Assignee: NEC Corporation, Tokyo, Japan

[21] Appl. No.: 388,453

[22] Filed: Feb. 14, 1995

[30] Foreign Application Priority Data

Feb. 16, 1994 [JP] Japan .................................. 6-042006

[51] Int. Cl.⁶ .................................................... G11C 7/00
[52] U.S. Cl. .................... 365/200; 365/185.09; 365/218; 371/10.2
[58] Field of Search ...................... 365/200, 185, 365/218; 371/10.1, 10.2, 10.3

[56] References Cited

U.S. PATENT DOCUMENTS

| | | | |
|---|---|---|---|
| 5,033,024 | 7/1991 | O'Connell et al. | 365/200 X |
| 5,185,718 | 2/1993 | Rinerson et al. | 365/185 |
| 5,195,057 | 3/1993 | Kasa et al. | 365/200 |
| 5,422,843 | 6/1995 | Yamada | 365/185 |
| 5,426,608 | 6/1995 | Hagashitani | 365/200 |

FOREIGN PATENT DOCUMENTS 2-5470   1/1990   Japan .

*Primary Examiner*—David C. Nelms
*Assistant Examiner*—Son Dinh
*Attorney, Agent, or Firm*—Young & Thompson

[57] ABSTRACT

A plurality of semiconductor memory cells are arranged in the form of a matrix and capable of electrically erasing and re-programming. Each of word lines is provided commonly to the memory cells in each row of the matrix and commonly connected to the gates of these memory cells, and each of bit lines is provided commonly to the memory cells in each column of the matrix and commonly connected to the drains of these memory cells. Each of common source lines is commonly connected to the sources of the memory cells in each pair of adjacent rows of the matrix. A memory cell group in a predetermined row or row pair of the matrix is operative as a redundant memory cell group for replacement of the other group.

16 Claims, 6 Drawing Sheets

NON-VOLATILE SEMICONDUCTOR MEMORY DEVICE HAVING A MEMORY CELL GROUP OPERATIVE AS A REDUNDANT MEMORY CELL GROUP FOR REPLACEMENT OF ANOTHER GROUP

BACKGROUND OF THE INVENTION

1. Field of the Invention

The present invention relates to a non-volatile semiconductor memory device, and, more particularly, to EEPROMs capable of electrical erasing and re-programming.

2. Details of the Related Art

Among this type of EEPROMs are those, there is a so-called a flash memory capable of collectively or simultaneously erasing a plurality of memory cells. This type of memory comprises memory elements (or memory cells) as basic units. FIG. 4 shows an example of such memory cell having a structure called stack gate type. As shown, the memory cell comprises a p-type semiconductor substrate 1, a gate insulating layer 2 with a thickness of about 10 nm formed on the surface of the substrate 1, a floating gate of polycrystalline silicon formed on the gate insulating layer 2, an insulating layer with a thickness of about 25 nm formed on the floating gate 3, and a control gate 5 formed on the insulating layer 4. Further, a source 7 and a drain 6 with n-type impurities are formed on the surface, not covered by the floating gate 3 and control gate 5, of the semiconductor substrate.

The operation of the prior art memory cell of this type will now be briefly described.

To write (or store) data in the memory cell, for instance, +7 V is applied to the drain 6, 0 V (ground potential) on the substrate 1 and the source 7, and about 12 V to the control gate 5. The floating gate is not connected to any external power supply, and its potential is determined absolutely from the potentials of the control gate, source, drain and semiconductor substrate on the basis of the specific electrostatic capacitance formed by the gate insulating layer 2 and the insulating layer 4 on the floating gate.

With such potential application to the individual electrodes, commonly called hot electrons having high energy are generated by a strong lateral electric field and some of the hot electrons are injected into the floating gate through the barrier of the gate insulating layer 2. As a result, data is written (or stored) in the memory cell.

To erase data in the memory cell is to pull out the hot electrons from the floating gate of the memory cell after the above writing of data (i.e., the storage of electrons in the floating gate). In many cases, this is made by the following process.

0 V (i.e., ground potential) is applied to the semiconductor substrate 1 and the control gate 5, and about 12 V is applied to the source 7, thereby causing a considerably strong electric field (which is 10 MV/cm or above with the foregoing potentials of the individual parts) across the gate insulating layer 2 between the source 7 and the floating gate 3. Under such a strong electric field, Fowler-Noldheim current (tunnel current) is caused to flow through the gate insulating layer in a quantum dynamic fashion. This result is utilized to effect pull-out of the electrons from the floating gate 3 into the source 7. In this way, data in the memory cell is erased.

In the case of the flash memory the writing of data in the above process is effected for each bit (memory cell), while the erasing of data is made collectively with respect to a group of memory cells having a certain scale. For this reason, the sources of the memory cells in the group of the scale for collective erasing are connected to a common source line to which a voltage of about +12 V is to be applied. This shorten the erasing time even in case where the whole memory device has a large memory capacity.

FIG. 5 schematically shows the structure of a prior art example of such flash memory cell array. In this array, a plurality of memory cells are arranged in the form of a matrix with m rows and n columns (m and n being positive integers not less than 2 and, in the example of FIG. 5, m=4 and n=2 for the sake of the brevity). The memory cells in each row have their gates commonly connected to the corresponding one of word lines W1 to W4, and the memory cells in each column have their drains commonly connected to the corresponding one of bit lines B1 and B2.

Spare memory cells CR called redundant memory cells are provided in the right end column of the memory cell array for replacement in operation of the columns C1 and C2 of the memory cell array. The gates of the redundant memory cells 1R to 4R are connected to the respective word lines W1 to W4, and drains thereof are commonly connected to a redundant bit line BR. For collective erasing of the memory cell array, the sources of all the memory cells are commonly connected to a common source line S. Transistors ST1 and ST2 are provided to set the common source line to either ground potential or an erasing potential (+12 V). By simultaneously turning on the transistors ST1 and ST2, the sources of all the memory cells are set to the ground potential. By turning on the sole transistor ST1, the erasing potential +12 V is provided from a row decoder/eraser circuit 9. Designated at 10 is a circuitry including a column decoder, a sense amplifier and a writing circuit, and at 8 a controller for controlling these circuits 9 and 10.

To write data in the memory cell 11, a potential of +12 V is applied on the word line W1 of the first row, while applying the ground potential on the other word lines W2 to W4. Also, +7 V is applied on the bit line B1 of the first column, while applying the ground potential on the other bit line and the common source line S. With the above setting of the individual potentials, the sole memory cell 11 is rendered conductive. Thus, under the principle described before in connection with FIG. 4, the electrons are injected into the floating gate of this memory cell, whereby the writing is made.

To erase data, +12 V is applied on the common source line S through the transistor ST1, and the word lines W1 to W4 are set to the ground potential. Further, all the bit lines are set to the ground potential. As a result, the electrons in the floating gate of each memory cell are pulled into the source thereof, effecting the erasing operation.

If it is found that at least one of the memory cells 11 to 41 in the first column fails to perform normal operation, the whole memory group C1 of the first column is replaced in operation by the redundant memory cell group CR, thus preventing all the memory cells from becoming defective due to the defectiveness of one bit.

In the prior art flash memory as described above, it is necessary to apply the common erasing voltage to the sources of the individual cells for collective erasing and the sources of the individual cells are to be commonly connected. Therefore, the redundant memory cell group CR, as shown in FIG. 5, can not be set as a unit extending along the word line (i.e., in the direction of the row), although it can be set as a unit extending along the bit line (i.e., in the direction of the column). The reason for this will now be described briefly.

Referring back to FIG. 5, it is assumed that the memory cells 41, 42 and 4R connected to the fourth word line W4 are redundant memory cells. In this case, if it is found that the memory cell 11 is defective, all the memory cells 11, 12 and 1R in the first row including the memory cell 11 are replaced in operation by the memory cells 41, 42 and 4R in the fourth row. At this time, the source line is not separated or disconnected, that is, the sources of all the memory cells are commonly connected. This means that at the time of the erasing the erasing voltage is applied to all the memory cells 11, 12 and 1R in the first row replaced in operation. Consequently, these memory cells 11, 12 and 1R may be brought to a commonly called excessive erasing state and be equivalent to depletion type MOS transistors so that they may be normally "on". Accordingly, the leakage current flows in the bit lines B1, B2 and BR connected to these memory cells 11, 12 and 1R through these "on" state memory cells. Therefore, when writing or reading out the data, the potential on each of the bit lines B1, B2 and BR fails to be increased up to a prescribed value, thus disabling the writing or reading operations.

Japanese Patent Laid-open No. Hei 2-5470 discloses a technique for preventing the leaks to bit lines due to making the memory cells to be of the depletion type. FIG. 6 shows the principal structure of this technique.

The structure shown in FIG. 6 is a memory cell array with 2 rows and 2 columns. The sources of the memory cells in the individual rows are commonly connected to respective source lines S1 and S2, and switching transistors SL1 and SL2 are each provided between each of the source lines S1 and S2 and a ground line SC, the transistors SL1 and SL2 being controlled by word lines W1 and W2 of the respective rows.

When the word line W1, for instance, is selected, the transistor SL1 is turned on, so that it is possible to write or read data in or out of the memory cells 11 and 12 that belong to the word line W1. In addition, since the transistor SL2 is turned off, the source line S2 of the memory cells 21 and 22 belonging to the word line W2 is separated or disconnected from the ground line SC. Thus, even when the memory cells 21 and 22 become the depletion type, the bit lines B1 and B2 will carry no leak current.

However, the above circuit structure has a drawback that although it is possible to prevent the leak current to bit lines due to a defective memory cell, the whole memory cell array becomes defective due to this defective memory cell, thus extremely deteriorating the yield of the product.

SUMMARY OF THE INVENTION

An object of the invention is therefore to provide a non-volatile semiconductor memory device capable of replacing in operation of a memory cell group of a row by a redundant memory cell.

Another object of the invention is to provide a non-volatile semiconductor memory device capable of replacing in operation of a memory cell group of a row as well as a memory cell group of a column by a redundant memory cell.

According to one aspect of the present invention, there is provided a non-volatile semiconductor memory device comprising: a plurality of non-volatile semiconductor memory cells arranged in the form of a matrix and capable of electrically erasing and re-programming, word lines each provided commonly to the memory cells in each row of the matrix and commonly connected to the gates of the memory cells, bit lines each provided commonly to the memory cells in each column of the matrix and commonly connected to the drains of the memory cells, and common source lines each commonly connected to the sources of the memory cells in each row of the matrix, a memory cell group in a predetermined row of the matrix being operative as a redundant memory cell group for replacement of the other group.

According to another aspect of the present invention, there is provided a non-volatile semiconductor memory comprising: a plurality of semiconductor memory cells arranged in the form of a matrix and capable of electrically erasing and re-programming, word lines each provided commonly to the memory cells in each row of the matrix and commonly connected to the gates of these memory cells, bit lines each provided commonly to the memory cells in each column of the matrix and commonly connected to the drains of these memory cells, and common source lines each commonly connected to the sources of the memory cells in each pair of adjacent rows of the matrix, a memory cell group in a predetermined row pair of the matrix being operative as a redundant memory cell group for replacement of the other group.

According to other aspect of the present invention, there is provided a non-volatile semiconductor device comprising: a plurality of non-volatile memory cells arranged in the form of a matrix and capable of electrical erasing and re-programming, word lines each provided commonly to the memory cells in each row of the matrix and connected commonly to the gates of these memory cells, bit lines each provided commonly to the memory cells in each column of the matrix and commonly connected to the drains of these memory cells, and common source lines commonly connected to the sources of the memory cells in each row group of N (N being 3 or a greater integer) adjacent rows, a memory cell group in a predetermined N row group being operative as a redundant memory cell group for replacement of the other group.

Other objects and features will be clarified from the following description with reference to attached drawings.

PREFERRED EMBODIMENTS OF THE INVENTION

Figure 1:
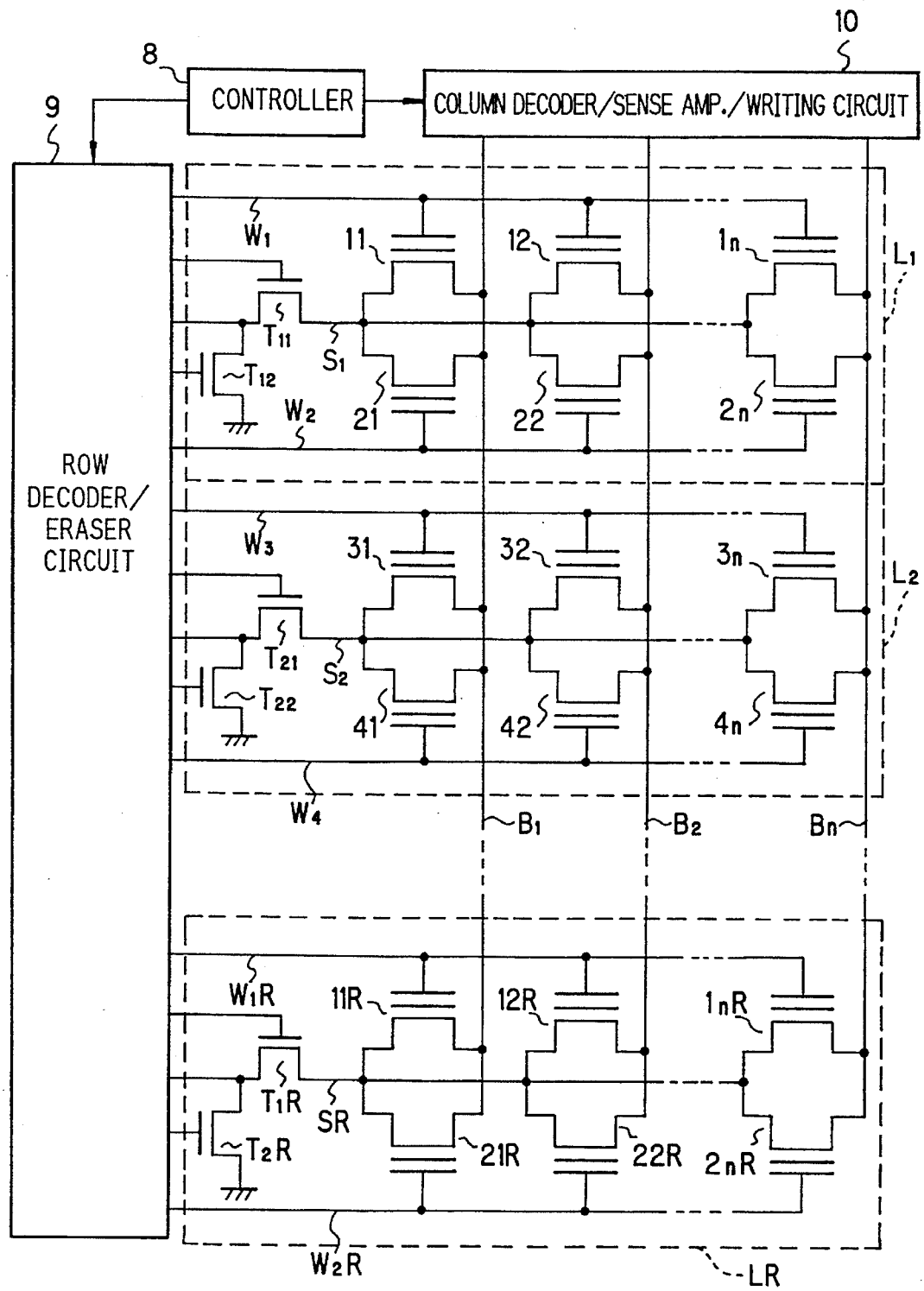
FIG. 1 is a schematic view showing an embodiment of the present invention.
Figure 5:
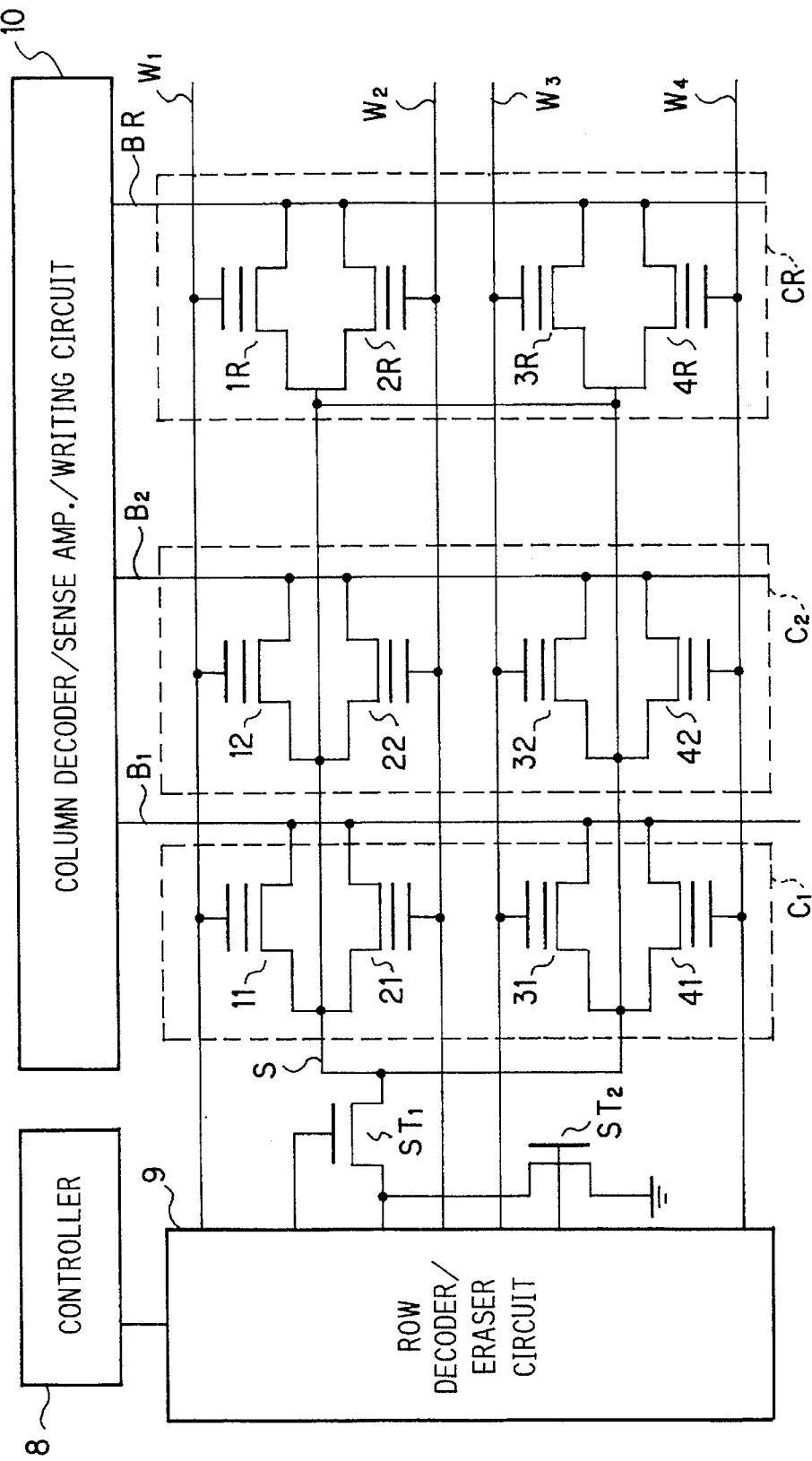
FIG. 5 schematically shows the structure of the prior art example of such flash memory cell array.
Figure 6:
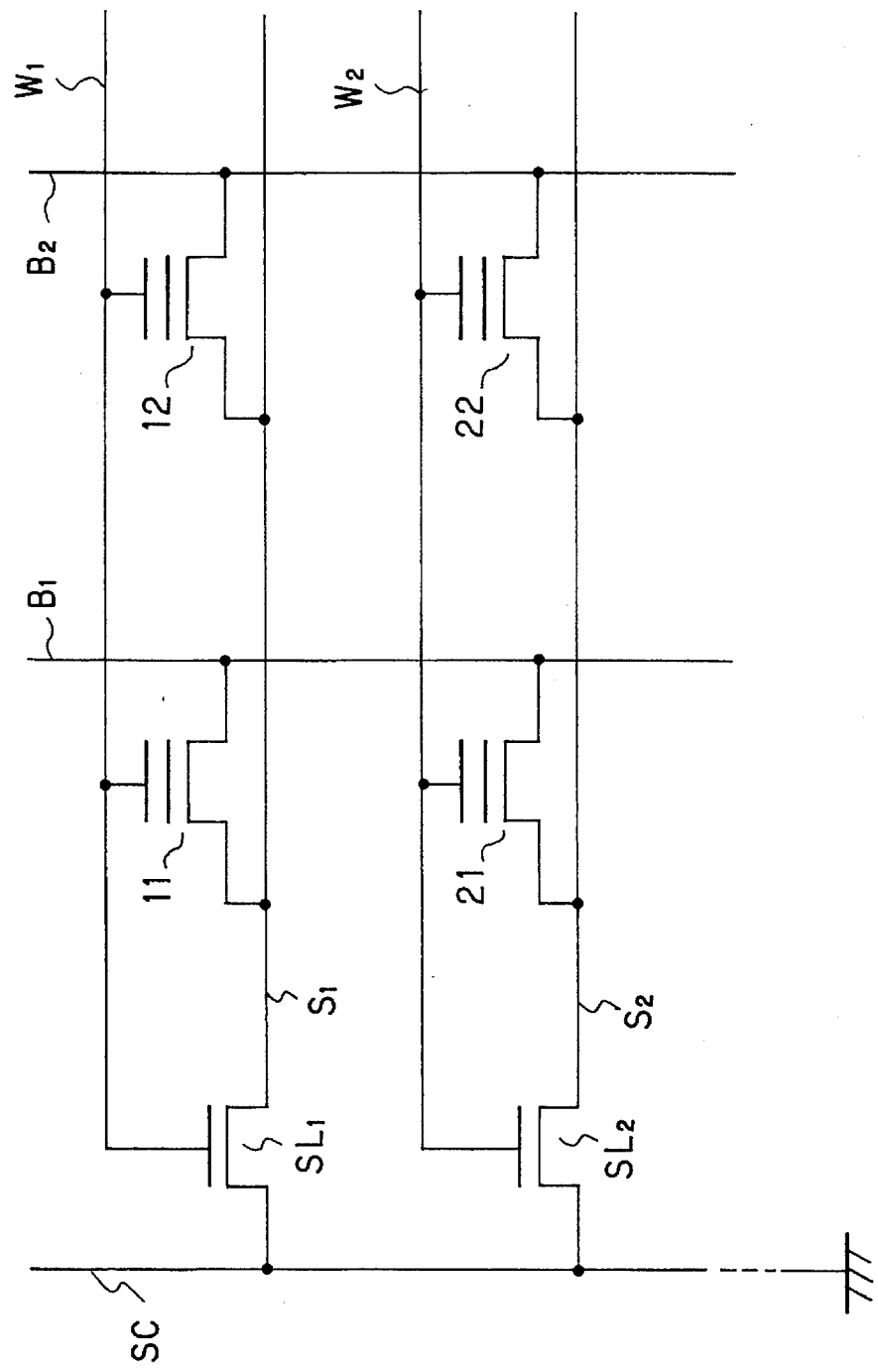
FIG. 6 shows the principal of the another prior art structure of the memory device.

FIG. 1 is a schematic view showing an embodiment of the present invention. Parts like those in FIG. 5 are designated by like reference numerals and symbols. In this embodiment, memory cells are arrayed in the form of a matrix with m rows and n columns.

In this embodiment, memory cell replacement in operation and collective or simultaneous erasing are made possible in units of every two adjacent rows L1, L2, . . . (e.g., first and second rows, third and fourth rows, . . . ). To this end, a redundant memory cell group LR is provided, which belongs to a pair of row lines, i.e., word lines W1R and W2R, and common source lines S1, S2, . . . , SR are provided in the respective pairs of row unit memory cell groups L1, L2, . . . , LR. The individual common source lines S1, S2, . . . , SR are provided with respective pairs of transistor circuits T11 and T12, T21 and T22 . . . , T1R and T2R for selectively providing potential to them. By selectively turning on the transistors T11, T21, . . . , T1R, the common source row pairs corresponding to the "on" transistors are set to the ground potential to be ready for writing the data. By selectively turning on the transistor pairs T11 and T12, T21 and T22, . . . , T1R and T2R, the common source row pairs corresponding to the "on" transistor pairs are set to +12 V to be ready for erasing.

If it is found that the memory cell 11, for instance, is defective, the row pair unit L1 with the memory cell 11 belonging thereto is entirely replaced in operation by the redundant memory cell group LR. Consequently, no erasing voltage is applied on the common source line S1 of the memory cells 11 to 1n and 21 to 2n belonging to the row pair L1 replaced in operation (that is, the transistor T11 is not selected). Thus, the memory cells 11 to 1n, 21 to 2n are not brought to the excessive erasing state to be of the depletion type (normally "on"). That is, there is no possibility of the leak current to the bit lines.

Since each pair of adjacent rows is made as a unit to be capable of replacement in operation the redundant memory cell group and also of collective erasing, it is possible to arrange the common source line at the mid position between the adjacent rows, as shown in FIG. 1, and also arrange the adjacent rows in line symmetry with respect to the common source line. Thus, it is possible to permit efficient layout design of the circuit and obtain improvement of the overall integration degree.

Figure 2:
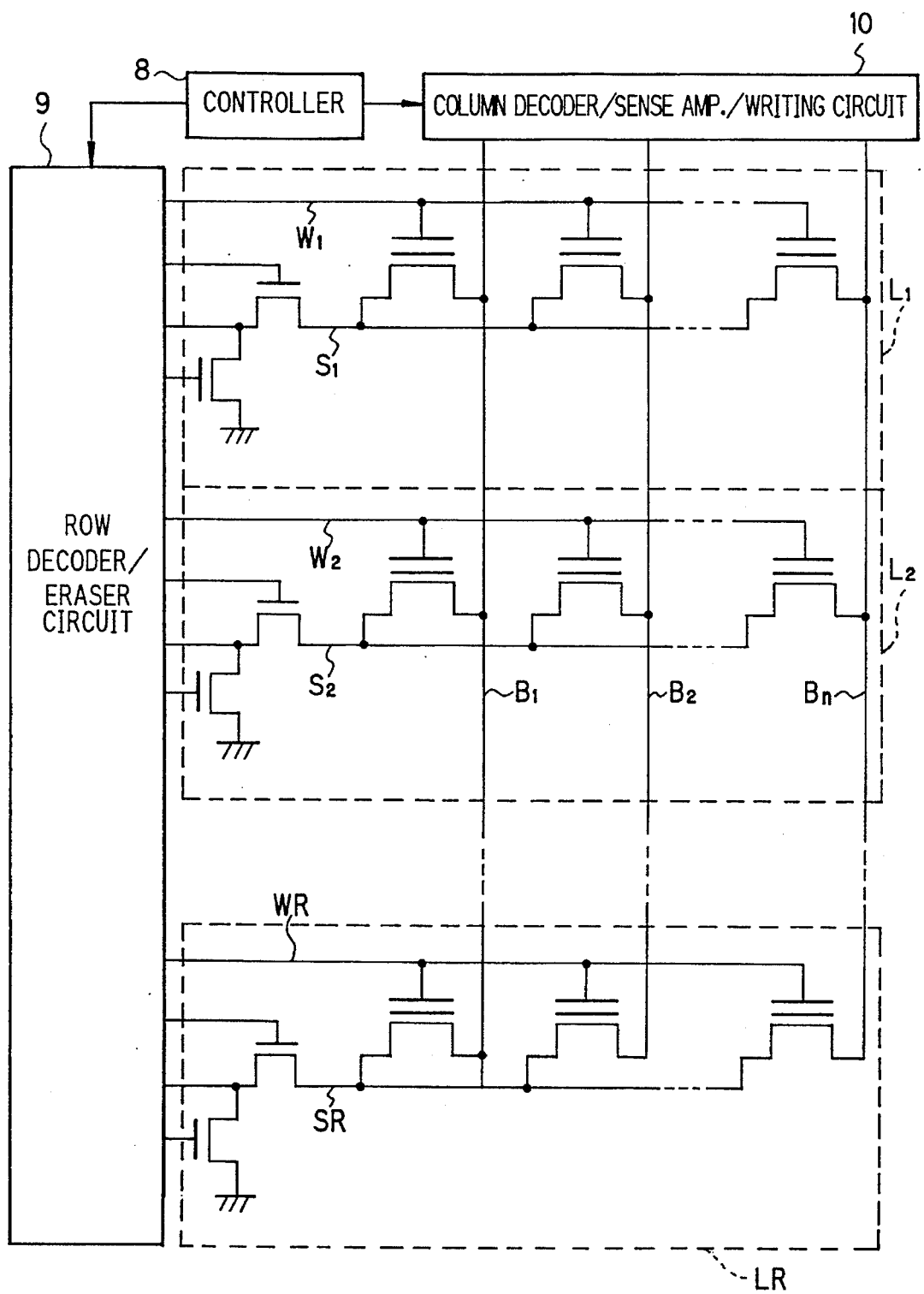
FIG. 2 shows a different embodiment of the present invention.

FIG. 2 shows a different embodiment of the present invention. In the preceding embodiment shown in FIG. 1, the collective erasing and the replacement are permitted for each of the memory cell units L1, L2, . . . , belonging to the respective adjacent row pairs as a unit. In this embodiment, the collective erasing and the replacement are permitted for each row as a unit. To this end, in individual row units L1, L2, . . . , LR, the sources of the memory cells are connected to the respective common source lines S1, S2, . . . , SR, and the common source lines are selectively held to the ground potential or +12 V for the respective row units. It will be obvious that the redundant memory cell group LR comprises memory cells of one row.

Figure 3:
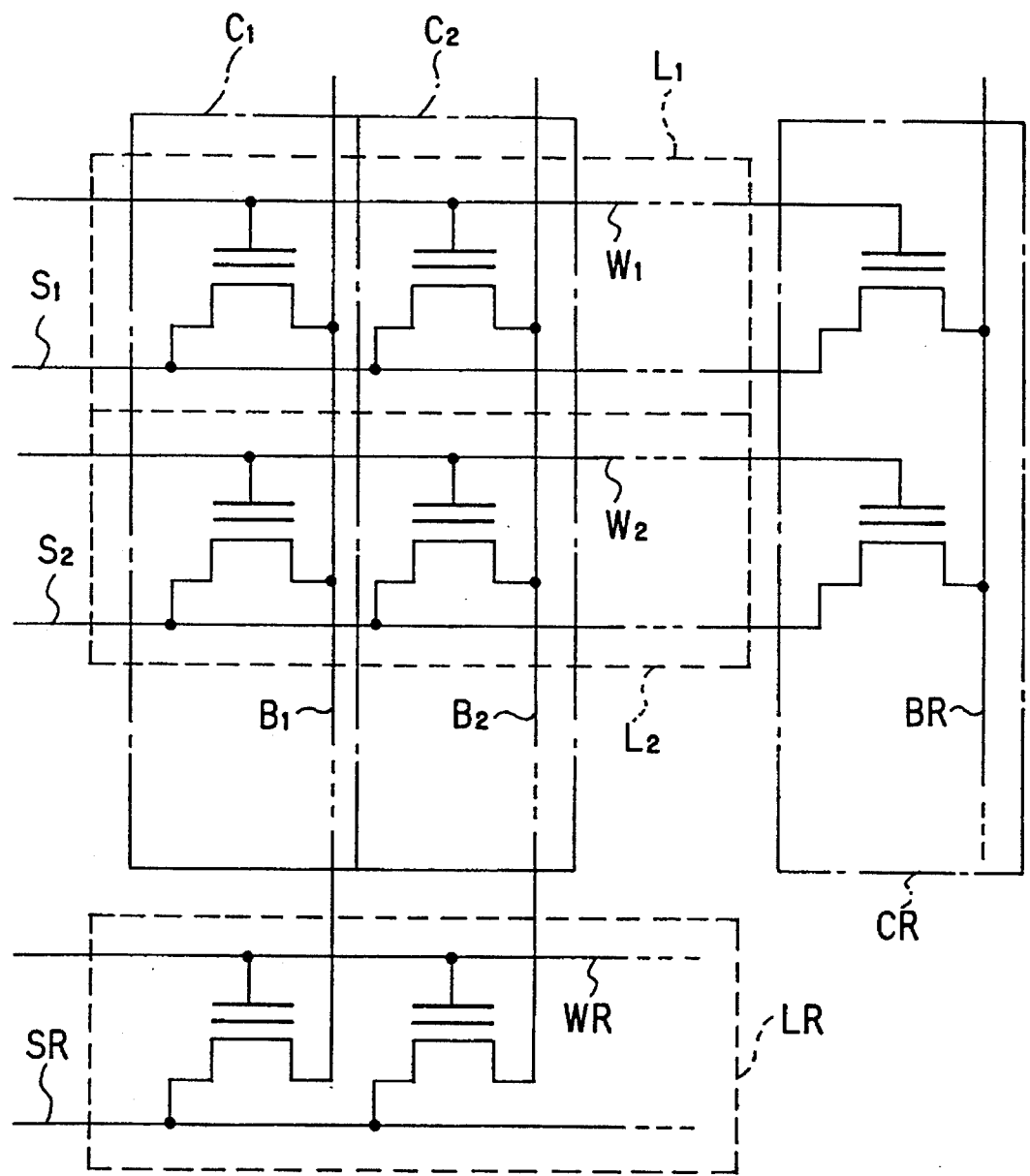
FIG. 3 shows a further embodiment of the present invention.
Figure 4:
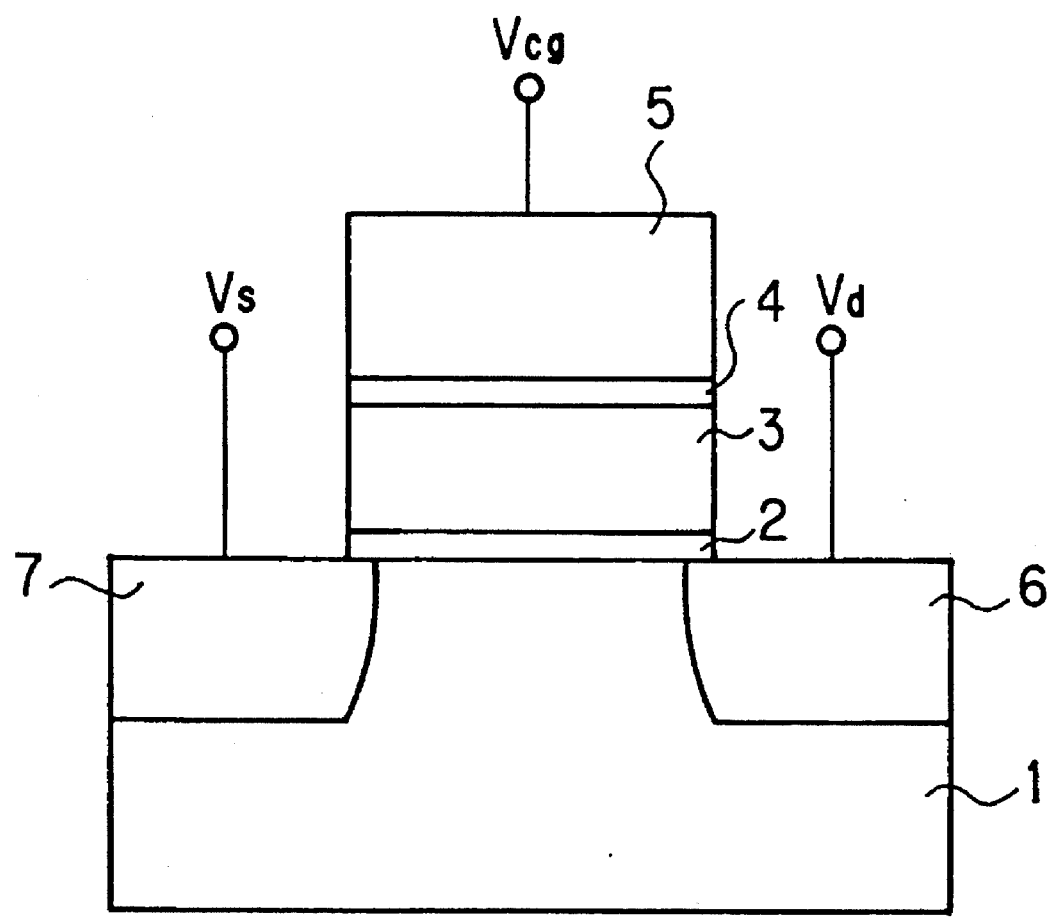
FIG. 4 shows an example of memory cell having a structure called stack gate type.

FIG. 3 shows a further embodiment of the present invention. In the FIG. 3, the peripheral circuitry of the memory is omitted, and only a memory matrix array portion is shown. In this embodiment, the collective erasing and replacement in operation for each column as a unit as in the prior art are permitted as well as the collective erasing and the replacement for each row as a unit as in the structure shown in FIG. 2. To this end, a redundant memory cell CR for columns is provided in addition to a redundant memory cell group LR for rows. If it is found that there is a defective cell in one of the row memory cell groups L1, L2, . . . , that row memory cell group is replaced in operation by the redundant memory cell group. Also, if it is found that there is a defective cell in one of the column memory cell groups C1, C2, . . . , that column memory cell group is replaced in operation by the redundant memory cell group CR. In the column redundant memory cell group CR, the individual memory cells are connected to the common source lines S1, S2, . . . of their rows. With this arrangement, it becomes possible to perform not only a row direction replacement but also a column direction replacement, thus further improving the reliability.

While the embodiment shown in FIG. 3 concerns the collective erasing and the replacement for each row as a unit, it is naturally possible to obtain as well the collective erasing and the replacement of each pair of adjacent rows as a unit as in the embodiment shown in FIG. 1. Further, it is obvious that it is possible to obtain generally the collective erasing and the replacement for N (N being 3 or greater integer) adjacent rows as a unit.

As has been described in the foregoing, while in the prior art the individual memory cells are commonly connected to a single source lines, according to the present invention separate source lines are each provided for each unit to be replaced in operation. It is thus possible to permit replacement by the row redundant memory cell group and permit effective coping with the memory cell defectiveness. Further, it is possible to combine the replacements for a row direction and a column direction, thus permitting improvement of the yield of memory devices.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A non-volatile semiconductor memory device comprising:

a plurality of non-volatile electrically erasable and reprogrammable semiconductor memory cells arranged in the form of a matrix;

word lines each provided commonly to the memory cells in each row of the matrix and commonly connected to gates of the memory cells;

bit lines each provided commonly to the memory cells in each column of the matrix and commonly connected to drains of the memory cells; and common source lines each commonly connected to sources of the memory cells in each row of the matrix;

a memory cell group in a predetermined row of the matrix being operative as a redundant memory cell group for replacement of the other group.

2. The non-volatile semiconductor memory according to claim 1, further comprising selecting means for selectively setting the common source lines of individual rows of the matrix to a predetermined voltage.

3. A non-volatile semiconductor memory comprising:

a plurality of electrically erasable and reprogrammable semiconductor memory cells arranged in the form of a matrix;

word lines each provided commonly to the memory cells in each row of the matrix and commonly connected to gates of these memory cells;

bit lines each provided commonly to the memory cells in each column of the matrix and commonly connected to drains of these memory cells; and common source lines each commonly connected to sources of the memory cells in each pair of adjacent rows of the matrix;

a memory cell group in a predetermined row pair of the matrix being operative as a redundant memory cell group for replacement of the other group.

4. The non-volatile semiconductor memory according to claim 3, further comprising selection means for selectively setting the common source lines of individual row pairs of the matrix to a predetermined voltage.

5. The non-volatile semiconductor memory according to claim 1, further comprising selection means for supplying an erasing potential sufficient to erase data stored in the memory cell to the common source lines.

6. The non-volatile semiconductor memory according to claim 3, further comprising selection means for supplying an erasing potential sufficient to erase data stored in the memory cell to the common source lines.

7. The non-volatile semiconductor memory according to claim 5, wherein all the memory cells connected to a common source line with the erasing potential selectively provided thereto by the selection means are simultaneously subjected to collective erasing.

8. The non-volatile semiconductor device according to one of claim 1, in which a memory cell group in a predetermined column of the matrix is operative as a redundant memory cell group for replacement of the other group.

9. The non-volatile semiconductor device according to one of claim 2, in which a memory cell group in a predetermined column of the matrix is operative as a redundant memory cell group for replacement of the other group.

10. The non-volatile semiconductor device according to one of claim 3, in which a memory cell group in a predetermined column of the matrix is operative as a redundant memory cell group for replacement of the other group.

11. The non-volatile semiconductor device according to one of claim 4, in which a memory cell group in a predetermined column of the matrix is operative as a redundant memory cell group for replacement of the other group.

12. The non-volatile semiconductor device according to one of claim 5, in which a memory cell group in a predetermined column of the matrix is operative as a redundant memory cell group for replacement of the other group.

13. The non-volatile semiconductor device according to one of claim 6, in which a memory cell group in a predetermined column of the matrix is operative as a redundant memory cell group for replacement of the other group.

14. The non-volatile semiconductor device according to one of claim 7, in which a memory cell group in a predetermined column of the matrix is operative as a redundant memory cell group for replacement of the other group.

15. A non-volatile semiconductor device comprising:

a plurality of non-volatile electrically erasable and reprogrammable memory cells arranged in the form of a matrix;

word lines each provided commonly to the memory cells in each row of the matrix and connected commonly to gates of these memory cells;

bit lines each provided commonly to the memory cells in each column of the matrix and commonly connected to drains of these memory cells; and common source lines commonly connected to sources of the memory cells in each row group of N (N being 3 or a greater integer) adjacent rows;

a memory cell group in a predetermined N row group being operative as a redundant memory cell group for replacement of the other group.

16. The non-volatile semiconductor memory according to claim 3, wherein said redundant memory cell group comprises two word lines to which gates of redundant memory cells are commonly connected, and a single source line to which sources of said redundant memory cells are commonly connected, wherein, upon failure of a word line of said memory, said failed word line and one other word line is replaced with said redundant memory cell group.

* * * * *